(12) United States Patent
Kagimura et al.

(10) Patent No.: US 8,995,145 B2
(45) Date of Patent: Mar. 31, 2015

(54) CIRCUIT BOARD UNIT

(75) Inventors: Sumio Kagimura, Osaka (JP); Hiroshi Doumae, Osaka (JP)

(73) Assignee: Daikin Industries, Ltd., Osaka-Shi, Osaka (JP)

( * ) Notice: Subject to any disclaimer, the term of this patent is extended or adjusted under 35 U.S.C. 154(b) by 438 days.

(21) Appl. No.: 13/504,807

(22) PCT Filed: Oct. 28, 2010

(86) PCT No.: PCT/JP2010/006372
§ 371 (c)(1),
(2), (4) Date: Apr. 27, 2012

(87) PCT Pub. No.: WO2011/052208
PCT Pub. Date: May 5, 2011

(65) Prior Publication Data
US 2012/0214321 A1    Aug. 23, 2012

(30) Foreign Application Priority Data

Oct. 29, 2009    (JP) ................. 2009-248492

(51) Int. Cl.
| | |
|---|---|
| *H05K 3/32* | (2006.01) |
| *H01R 4/34* | (2006.01) |
| *H01R 12/51* | (2011.01) |
| *H01R 12/58* | (2011.01) |
| *H05K 1/02* | (2006.01) |
| *H05K 1/18* | (2006.01) |

(52) U.S. Cl.
CPC .. *H05K 3/32* (2013.01); *H01R 4/34* (2013.01); *H01R 12/515* (2013.01); *H01R 12/585* (2013.01); *H05K 1/0263* (2013.01); *H05K 1/18* (2013.01); *H05K 2201/09063* (2013.01); *H05K 2201/10166* (2013.01); *H05K 2201/10287* (2013.01); *H05K 2201/10295* (2013.01); *H05K 2201/10409* (2013.01); *H05K 2201/1053* (2013.01); *H05K 2201/10545* (2013.01); *H05K 2201/10962* (2013.01)
USPC .............................. 361/760; 361/761; 439/78

(58) Field of Classification Search
USPC .................................... 361/760, 761; 439/78
See application file for complete search history.

(56) References Cited

U.S. PATENT DOCUMENTS

| | | |
|---|---|---|
| 1,177,346 A | 3/1916 | Mateer |
| 3,325,774 A | 6/1967 | Tucker, Jr. |
| 3,384,853 A | 5/1968 | Rademacher |
| 3,624,588 A | 11/1971 | Farmer |
| 4,123,132 A | 10/1978 | Hardy et al. |

(Continued)

FOREIGN PATENT DOCUMENTS

| | | |
|---|---|---|
| JP | 4-273190 A | 9/1992 |
| JP | 6-302932 A | 10/1994 |

*Primary Examiner* — Andargie M Aychillhum
(74) *Attorney, Agent, or Firm* — Birch, Stewart, Kolasch & Birch, LLP

(57) ABSTRACT

A circuit board unit includes a printed circuit board and a terminal block mounted on the printed circuit board and connecting a power module and an electrical wire together. The terminal block includes a terminal connection part to be directly connected to the power module, and a wire connection part to be connected to the electrical wire. In the printed circuit board, a hole having an orthographic projection area larger than that of the terminal connection part as viewed in plane is formed. The terminal connection part is positioned below or above the hole of the printed circuit board.

6 Claims, 15 Drawing Sheets

(56) References Cited

U.S. PATENT DOCUMENTS

| | | |
|---|---|---|
| 4,630,882 A | 12/1986 | Naylor et al. |
| 4,680,672 A | 7/1987 | May et al. |
| 4,732,568 A | 3/1988 | Hall |
| 4,738,638 A | 4/1988 | Bogese, II |
| 4,792,880 A | 12/1988 | Cather et al. |
| 5,741,161 A | 4/1998 | Cahaly et al. |
| 6,242,993 B1 | 6/2001 | Fleege et al. |
| 6,302,709 B1 * | 10/2001 | Ross ................................ 439/78 |
| 6,632,108 B1 | 10/2003 | Hohlfelder |

* cited by examiner

FIG.15
(A)
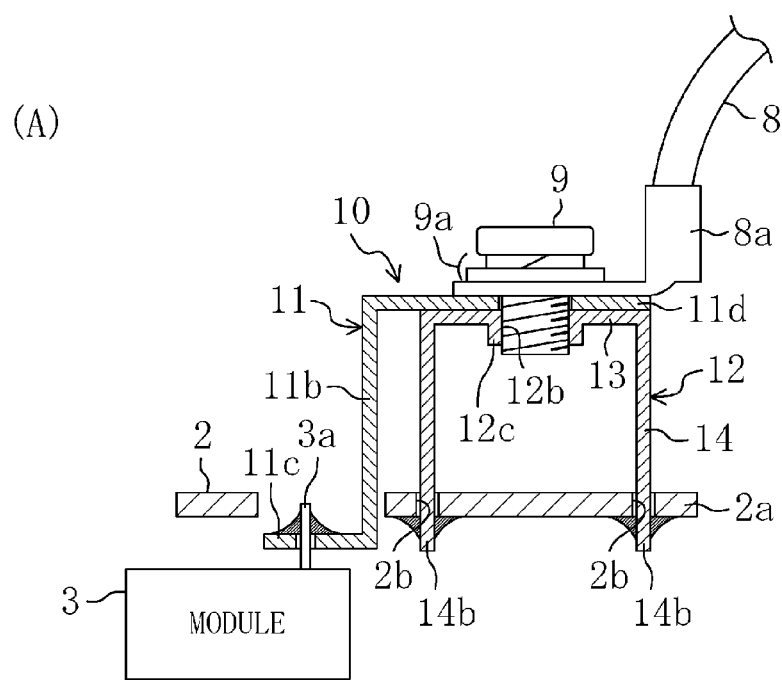
(B)
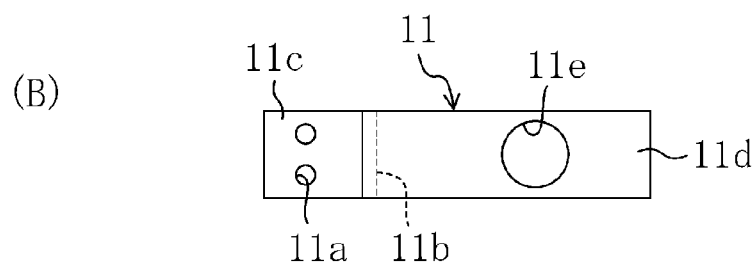

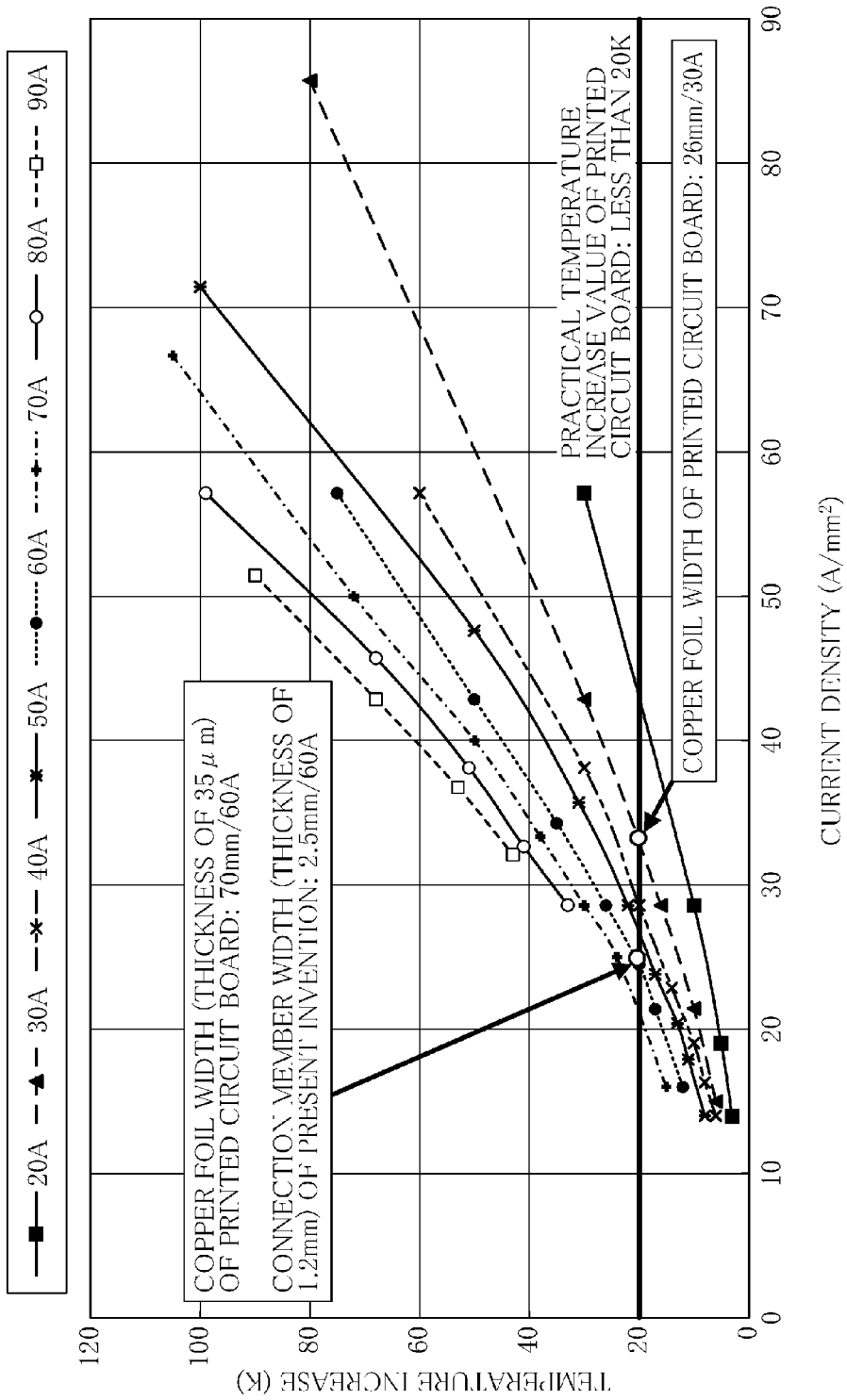

CIRCUIT BOARD UNIT

TECHNICAL FIELD

The present invention relates to a circuit board unit in which a circuit element of an electrical circuit and electrical wires are connected together, and particularly relates to a connection member structure.

BACKGROUND ART

In general, when a power supply circuit element such as a power module (a power module will be described below as a representative example of power supply circuit elements) is mounted on a printed circuit board in the circuit board unit, terminal pins of the power module are bonded to a printed wire (copper foil) of a main circuit on the printed circuit board. For example, an inverter module is used as the power module in a refrigerating apparatus (the refrigerating apparatus described herein includes an air conditioning apparatus). Such a power module is connected between an external power supply and an inverter compressor (target to be driven). Current supplied through terminal pins of the power module flows through copper foil of a main circuit of a printed circuit board and then is supplied to the compressor.

Recently, even high power modules have been reduced in size with improvement in performance of semiconductor devices. Thus, an interval between terminal pins provided on the power module tends to be narrowed. There is a power module directly soldered to a printed circuit board and rated at high current of 50-100 A. A small-size power module has a small cross-sectional area of a terminal pin, resulting in an increase in temperature of the terminal pin due to heat from a chip of the power module. In addition, the temperature in a connection part between a printed circuit board and the terminal pin increases and, as a result, exceeds the heat resistant temperature of the printed circuit board. Thus, there is a possibility that the printed circuit board cannot be used up to the rated current.

If, e.g., a circuit board unit used for an inverter control of the foregoing air conditioner is rated at the high current level described above, it is necessary to expand a cross-sectional area of a printed wire (copper foil) including the connection part to lower a resistance value. However, in order to lower the resistance value, it is necessary to expand the width of the copper foil because the thickness of the copper foil cannot be extremely increased.

The expansion of the copper foil width is contradictory to the narrowing of the interval between the terminal pins of the power module. Thus, it is not practical that, in the printed circuit board unit using the high power module having the narrow interval between the terminal pins, the width of the copper foil is expanded so that high current can flow through the printed circuit board unit.

Patent Document 1 discloses the configuration in which a terminal base to be bonded onto a printed circuit board is used as a connection member (10) of an electrical circuit and a terminal pin of a power module is screwed to the terminal base.

CITATION LIST

Patent Document

PATENT DOCUMENT 1: Japanese Patent Publication No. H06-302932

SUMMARY OF THE INVENTION

Technical Problem

In the configuration described in Patent Document 1, current supplied through the terminal pins flows into the terminal bases which are the connection members. The cross-sectional area of a current path can be expanded by using the terminal bases. Thus, for the terminal base, a resistance value can be lowered and the amount of heat generation can be decreased. Patent Document 1 relates to a screw terminal type module. The cross-sectional area of the terminal pin is large, thereby reducing the heat generation.

The terminal base of Patent Document 1 is soldered to the printed circuit board in a position where the terminal base contacts a printed wire (copper foil) of a main circuit, and then current flows through the copper foil. Since the power module is large, the width of the copper foil can be expanded. However, if the module size is reduced, it is difficult to extremely expand the width of the copper foil, and such a condition causes a limitation of a design of the printed circuit board. In addition, if the width of the printed wire (copper foil) of the main circuit is expanded, the size of the printed circuit board itself is increased.

In, e.g., a general printed circuit board, the thickness of copper foil is only about 35 μm, and only current of about 1 A can flow per width of 1 mm. For a flow of current of 30 A through the copper foil having the foregoing thickness, a foil width of about 30 mm is required. For a flow of current of 50 A through the copper foil having the foregoing thickness, a foil width of about 50 mm is required. On the other hand, an interval between terminals of a power module is about 5-10 mm at the narrowest. Considering an insulating distance between the terminals, it has been practically impossible that a flow of high current through a circuit board unit can be realized by devising only a wiring pattern.

The following methods have been conventionally employed in order to provide a printed circuit board unit through which high current can flow: by providing a heat dissipating fin on a pattern to decrease a temperature; by using a high-cost printed circuit board having thick copper foil; or by soldering a purpose-built thick jumper wire to part of a printed circuit board near a terminal However, such methods result in increased cost. In addition, although high current can flow through the pattern of the printed wire, current of about 30 A flows therethrough at the highest.

The present invention has been made in view of the foregoing, and it is an objective of the invention that, by using a connection member, higher current than current flowing through a conventional circuit board unit can flow a circuit board unit in which circuit elements such as a power module are mounted on a printed circuit board.

Solution to the Problem

A first aspect of the invention is directed to a circuit board unit including a printed circuit board (2); and a connection member (10) attached to the printed circuit board (2) and connecting a circuit element (3) of an electrical circuit and an electrical wire (8) together.

The connection member (10) includes a terminal connection part (11) directly connected to a terminal pin (3a) of the circuit element (3), and a wire connection part (12) connected to the electrical wire (8). The wire connection part (12) has a seat plate (13), and a leg part (14) downwardly extending from the seat plate (13), a lower end part of the leg part (14) being fixed to the printed circuit board (2). The terminal connection part (11) is formed in a plate shape extending from the wire connection part (12) and has a pin connection part (11c) for the terminal pin (3a).

A hole (2c) having an orthographic projection area at least larger than that of the pin connection part (11c) of the terminal connection part (11) as viewed in plane is formed in the printed circuit board (2). The terminal connection part (11) is configured such that at least the pin connection part (11c) is positioned below or above the hole (2c) of the printed circuit board (2).

A second aspect of the invention is directed to a circuit board unit including a printed circuit board (2); and first and second connection members (10) attached to the printed circuit board (2) and connecting a circuit element (3) of an electrical circuit and an electrical wire (8) together.

Each of the first and second connection members (10) includes a terminal connection part (11) directly connected to a terminal pin (3a) of the circuit element (3), and a wire connection part (12) connected to the electrical wire (8). The wire connection part (12) has a seat plate (13), and a leg part (14) downwardly extending from the seat plate (13), a lower end part of the leg part (14) being fixed to the printed circuit board (2). The terminal connection part (11) is formed in a plate shape extending from the wire connection part (12) and has a pin connection part (11c) for the terminal pin (3a).

A hole (2c) having an orthographic projection area at least larger than that of the pin connection part (11c) of the terminal connection part (11) as viewed in plane is formed corresponding to the pin connection part (11c) in the printed circuit board (2). The terminal connection part (11) of the first connection member (10) is configured such that at least the pin connection part (11c) is positioned below the hole (2c) of the printed circuit board (2). The terminal connection part (11) of the second connection member (10) is configured such that at least the pin connection part (11c) is positioned inside the hole (2c) of the printed circuit board (2).

A third aspect of the invention is directed to a circuit board unit including a printed circuit board (2); and first and second connection members (10) attached to the printed circuit board (2) and connecting a circuit element (3) of an electrical circuit and an electrical wire (8) together.

Each of the first and second connection members (10) includes a terminal connection part (11) directly connected to a terminal pin (3a) of the circuit element (3), and a wire connection part (12) connected to the electrical wire (8). The wire connection part (12) has a seat plate (13), and a leg part (14) downwardly extending from the seat plate (13), a lower end part of the leg part (14) being fixed to the printed circuit board (2). The terminal connection part (11) is formed in a plate shape extending from the wire connection part (12) and has a pin connection part (11c) for the terminal pin (3a).

A hole (2c) having an orthographic projection area at least larger than that of the pin connection part (11c) of the terminal connection part (11) as viewed in plane is formed corresponding to the pin connection part (11c) in the printed circuit board (2). The terminal connection part (11) of the first connection member (10) is configured such that at least the pin connection part (11c) is positioned above the hole (2c) of the printed circuit board (2). The terminal connection part (11) of the second connection member (10) is configured such that at least the pin connection part (11c) is positioned inside the hole (2c) of the printed circuit board (2).

A fourth aspect of the invention is directed to the circuit board unit of any one of the first to third aspects of the invention, in which the terminal connection part (11) further has a joint part (11b) connected to the leg part (14) and bent at right angle with the leg part (14), and the pin connection part (11c) connected to the joint part (11b) at a tip end thereof.

A fifth aspect of the invention is directed to the circuit board unit of any one of the first to third aspects of the invention, in which the terminal connection part (11) further has a joint part (11b) connected to the leg part (14) and bent at oblique angle with the leg part (14), and the pin connection part (11c) connected to the joint part (11b) at a tip end thereof.

A sixth aspect of the invention is directed to the circuit board unit of any one of the first to third aspects of the invention, in which the wire connection part (12) of the connection member (10) is formed from a single member, and the terminal connection part (11) is formed from another member different from the wire connection part (12).

In each of the first to third aspects of the invention, the terminal pin (3a) of the power supply circuit element (3) such as a power module (3) is connected to the terminal connection part (11) of the connection member (10), and the electrical wire (8) is connected to the wire connection part (12) of the connection member (10). Thus, current supplied from the circuit element (3) is supplied to a target to be driven through the connection member (10) and the electrical wire (8). That is, high current of the power supply circuit element (3) can be prevented from flowing through a wiring pattern.

The terminal pin (3a) of the circuit element (3) is bonded to the terminal connection part (11) arranged in the position corresponding to the hole (2c) formed in the printed circuit board (2), and the electrical wire (8) is connected to the wire connection part (12). Current from the circuit element (3) flows into the electrical wire (8) through the connection member (10). Thus, it is less likely that heat from the circuit element (3) is transferred to the printed circuit board (2). Thus, high current can flow through the electrical wire (8).

The terminal pin (3a) of the circuit element (3) is bonded to the terminal connection part (11) arranged parallel to the printed circuit board (2) outside the hole (2c) formed in the printed circuit board (2), and the electrical wire (8) is connected to the wire connection part (12). Current from the circuit element (3) flows into the electrical wire (8) through the connection member (10). Thus, it is much less likely that heat from the circuit element (3) is transferred to the printed circuit board (2).

In the fifth aspect of the invention, since the joint part (11b) is inclined, the width of the joint part (11b) can be increased. Thus, a passage of high current is allowed and a heat dissipation effect through the joint part (11b) is exhibited.

In the sixth aspect of the invention, the terminal connection part (11) which is a first member is connected to the terminal pin (3a) of the circuit element (3) such as the power module (3), and the electrical wire (8) is connected to the wire connection part (12) which is a second member. In addition, the wire connection part (12) for supporting the terminal connection part (11) is attached to the printed circuit board (2).

Advantages of the Invention

In the present invention, the terminal connection part (11) of the connection member (10) is connected to the terminal pin (3a) of the circuit element (3) such as the power module (3), and the electrical wire (8) is attached to the wire connection part (12) of the connection member (10). Thus, according to the present invention, since current supplied from the power supply circuit element (3) is supplied to the target to be driven through the connection member (10) and the electrical wire (8), current of a main circuit of a power supply system can be prevented from flowing through the wiring pattern (copper foil) of the printed circuit board (2). As a result, since the thickness and width of the copper foil of the printed circuit board (2) are not necessarily increased and a heat dissipating fin is not necessarily provided on the wiring pattern, a flow of high current through the circuit board unit can be realized without a size increase, and a cost increase can be prevented.

Since a thick material is used for the connection member (10), a temperature increase can be reduced, thereby improving a heat transfer across the entirety of the connection member (10). As a result, the power module which is the circuit element (3) can be used up to the limitation of current which can flow through a chip embedded in the power module.

Since the terminal connection part (11) is arranged in the position corresponding to the hole (2c) formed in the printed circuit board (2), the terminal connection part (11) can be exposed to air therearound. Thus, heat dissipation from the connection member (10) can be promoted. In addition, since the printed circuit board (2) and the terminal connection part (11) do not contact each other, it is less likely that heat from the circuit element (3) is transferred to the printed circuit board (2), and therefore high current can flow through the electrical wire (8).

Since the terminal pin (3a) of the circuit element (3) is bonded to the terminal connection part (11) in the position below or above the hole (2c) formed in the printed circuit board (2), it is much less likely that heat from the circuit element (3) is transferred to the printed circuit board (2).

According to the second or third aspect of the invention, the following is provided: the connection member (10) including the terminal connection part (11) bonded to the terminal pin (3a) of the circuit element (3) outside the hole (2c) of the printed circuit board (2); and the connection member (10) including the terminal connection part (11) bonded to the terminal pin (3a) of the circuit element (3) inside the hole (2c) of the printed circuit board (2). Thus, even the case where the circuit elements (3) are different from each other in height thereof can be easily handled.

Particularly in the case where the circuit elements (3) are different from each other in height thereof, the height of a support of the circuit element (3) is conventionally adjusted to a higher or lower level, resulting in a complex process. According to the second or third aspect of the invention, the connection member (10) is selectively used, the connection member (10) can be employed for the circuit elements (3) having different heights. As a result, workability can be improved.

According to the fifth aspect of the invention, since the joint part (11b) is inclined, the width of the joint part (11b) can be increased. Thus, a passage of high current is allowed and a heat dissipation effect through the joint part (11b, 14a) is exhibited.

According to the sixth aspect of the invention, since the terminal connection part (11) and the wire connection part (12) supporting the terminal connection part (11) are the separate members, only the terminal connection part (11) may be replaced corresponding to the height of the terminal pin (3a) of the power module (3).

BRIEF DESCRIPTION OF THE DRAWINGS

FIG. 15 illustrates a terminal block of a fifth embodiment. FIG. 15(A) is a cross-sectional view of a main part of the terminal block in a connection state. FIG. 15(B) is a plan view of the main part of the terminal block.

FIG. 16 is a graph illustrating a relationship between the dimension of a terminal block and a temperature increase.

DESCRIPTION OF EMBODIMENTS

Embodiments of the present invention will be described below in detail with reference to drawings.

First Embodiment of the Invention

A first embodiment relates to a circuit board unit used for a control device of a refrigerating apparatus (air conditioning apparatus).

Figure 1:
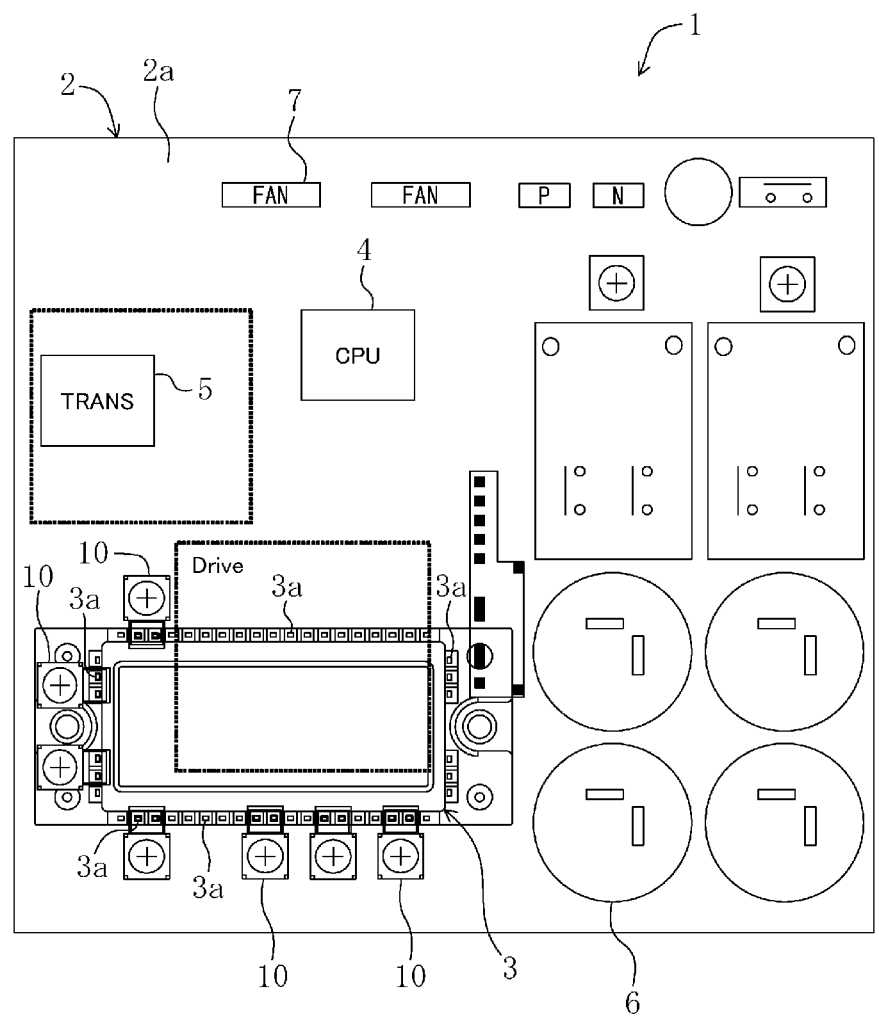
FIG. 1 is a plan view of a circuit board unit of a first embodiment of the present invention.

As illustrated in FIG. 1, a circuit board unit (1) of the first embodiment is configured such that a power supply circuit element such as a power module (inverter module to be connected to an external power supply) (3) and other electronic components (4, 5, 6, 7) are mounted on a printed circuit board (2). Since the power module (3) is positioned on a back side of the printed circuit board (2), part of the circuit board unit (1) should be indicated by a dashed line. However, for convenience, such part is indicated by a solid line in the figure.

The electronic components (4, 5, 6, 7) provided on the printed circuit board (2) are a central processing unit (CPU) (4), a transformer (5), capacitors (6), and connectors (7) for other devices. Each of terminal pins (3a) of the power module (3) upwardly extends (extends toward a near side relative to the plane of the figure) so as to penetrate the printed circuit board (2).

The circuit board unit (1) includes terminal blocks (10) fixed to the printed circuit board (2). Each of the terminal blocks (10) is connected to the terminal pins (3a) of the power module (3) upwardly protruding through the printed circuit board (2) and to an electrical wire (8) illustrated in FIG. 3 which is a side view of a main part of FIG. 1. That is, the terminal block (10) connects the power supply power module (3) of an electrical circuit including the printed circuit board (2) to the electrical wire (8).

The terminal block (10) serves as a connection member formed in an inverted U-shape having an opening at the bottom thereof as viewed from the side.

Figure 2:
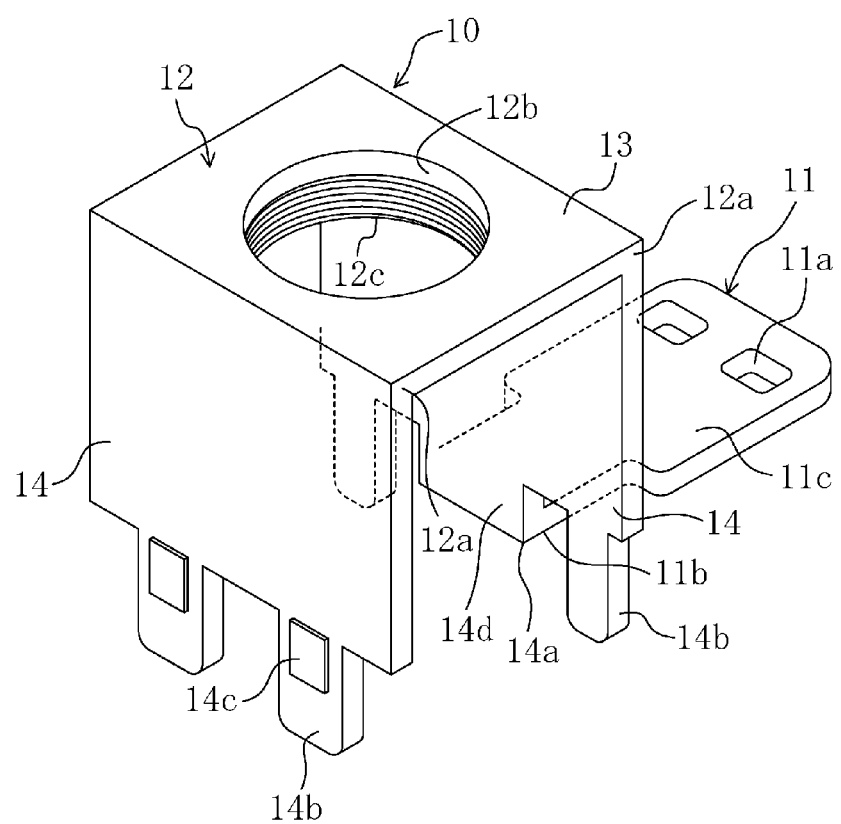
FIG. 2 is an enlarged perspective view of a terminal block.

As illustrated in an enlarged perspective view of FIG. 2, the terminal block (10) includes a terminal connection part (11) to be directly connected to the terminal pins (3a) of the power module (3), and a wire connection part (12) to be connected to the electrical wire (8). The terminal block (10) is a component having an actual dimension of about 10 mm×10 mm when the wire connection part (12) is viewed in the plane. The wire connection part (12) includes a seat plate (13) and a pair of leg parts (14) which downwardly extends from the seat plate (13) in the direction perpendicular to the seat plate (13) and which are to be fixed to the printed circuit board (2). The leg parts (14) are attached to predetermined attachment positions of a board part (2a) of the printed circuit board (2). In the present embodiment, the board part (2a) of the printed circuit board (2) indicates part of the printed circuit board (2) where a printed wire (copper foil) is not provided. Note that a wiring pattern formed of copper foil is not shown in FIG. 1.

Figure 5:
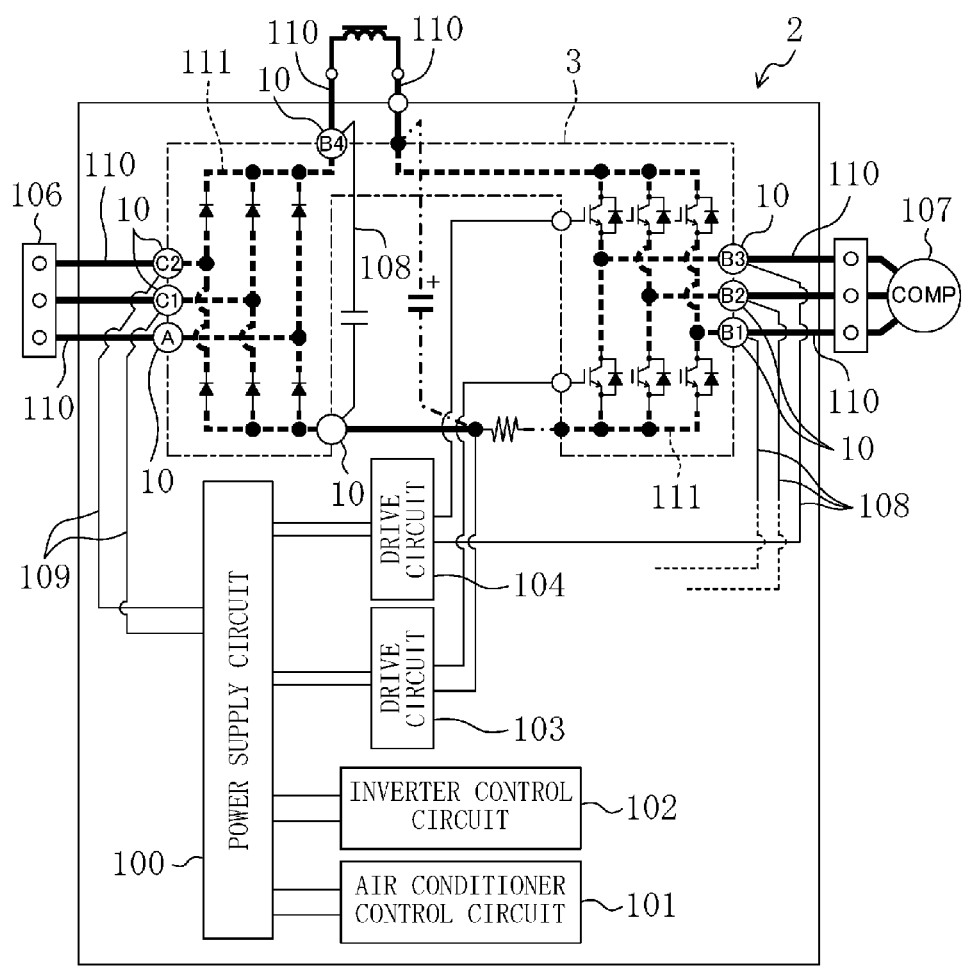
FIG. 5 is a block diagram illustrating a circuit configuration of a printed circuit board.

FIG. 5 is a block diagram illustrating a circuit configuration of the printed circuit board (2). A power supply circuit (100), an air conditioner control circuit (101), an inverter control circuit (102), drive circuits (103, 104), and the power module (3) which is the inverter module are provided on the printed circuit board (2). The power module (3) is connected between a power supply (106) and a compressor (107) (corresponding to a later-described compressor (52) of a refrigerant circuit of FIG. 7 which will be described later). The power module (3) is configured such that various electronic components such as a chip are connected together. Note that a bold dashed line indicates an internal wire (111) for connecting the electronic components of the power module (3) together.

Figure 6:
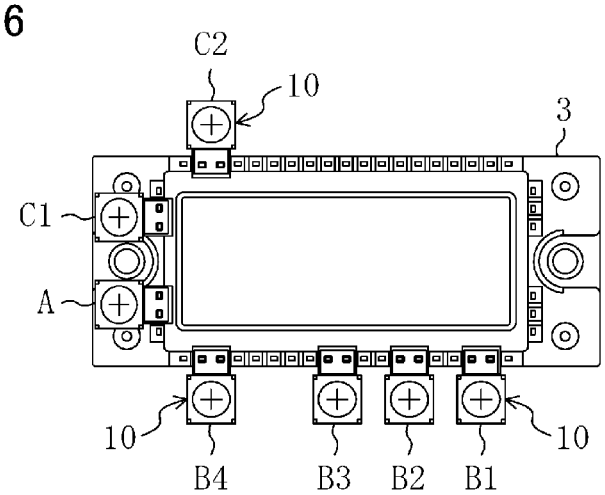
FIG. 6 is a plan view illustrating a relationship among positions in each of which a power module and the terminal block are connected together.

FIG. 6 is a plan view illustrating a relationship among positions in each of which the power module (3) and the terminal block (10) are connected together, and reference characters A-C in FIG. 6 corresponds to reference characters A-C illustrated in FIG. 5. The terminal blocks (10) can be categorized into three types of A-C. The first terminal block (10) indicated by the reference character A is the terminal block (10) through which current of a main circuit flows only into an electrical cable (110). The second terminal blocks (10) indicated by the reference characters B1-B4 are the terminal blocks (10) through each of which high current of the main circuit flows into the electrical cable (110), and are each connected to a trace (108) of e.g., the drive circuit (103, 104) or a snubber circuit through which low current flows. The third terminal bases (10) indicated by the reference characters C1 and C2 are the terminal bases (10), each of which is connected to the electrical cable (110) and a trace (109) of the power-supply circuit (100) through which low current for control flows. Only one of three arms of the drive circuit (103, 104) is illustrated, and the other arms are not shown in the figure. As described above, the terminal base (10) can be used for various purposes.

In FIG. 6, each of the terminal bases (10) indicated by the reference characters A, B1-B4, C1, and C2 connects the terminal pins (3a) of the power module (3) to the electrical wire (8). Each of the terminal blocks (10) indicated by the reference characters B1-B4, C1, and C2 other than the terminal block (10) indicated by the reference character A is connected to a wiring pattern of the control circuit or the drive circuit. Each of the terminal blocks (10) indicated by the reference characters B1-B4, C1, and C2 allows current of a main circuit of a drive system to flow through the power module (3) and the electrical wire (8), and therefore only minute current flows through the copper foil which is the wiring pattern. As a result, a problem that an influence of heat on the printed circuit board (2) is increased due to an increase in temperature of the copper foil is not caused.

Figure 3:
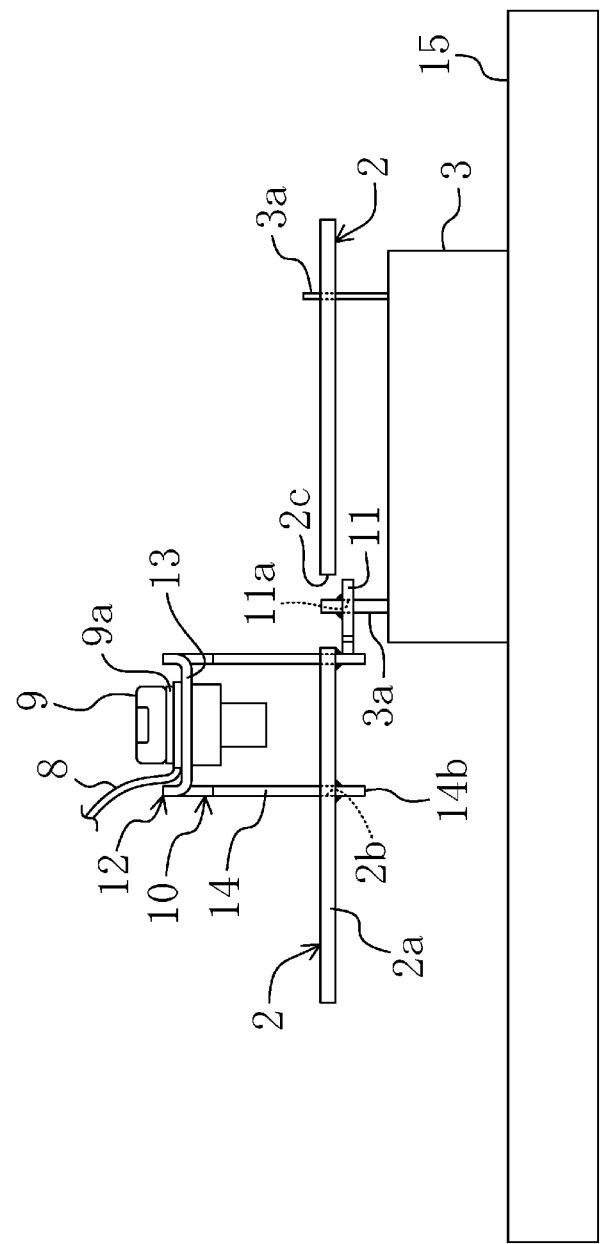
FIG. 3 is a side view illustrating a main part of the circuit board unit of FIG. 1.
Figure 4:
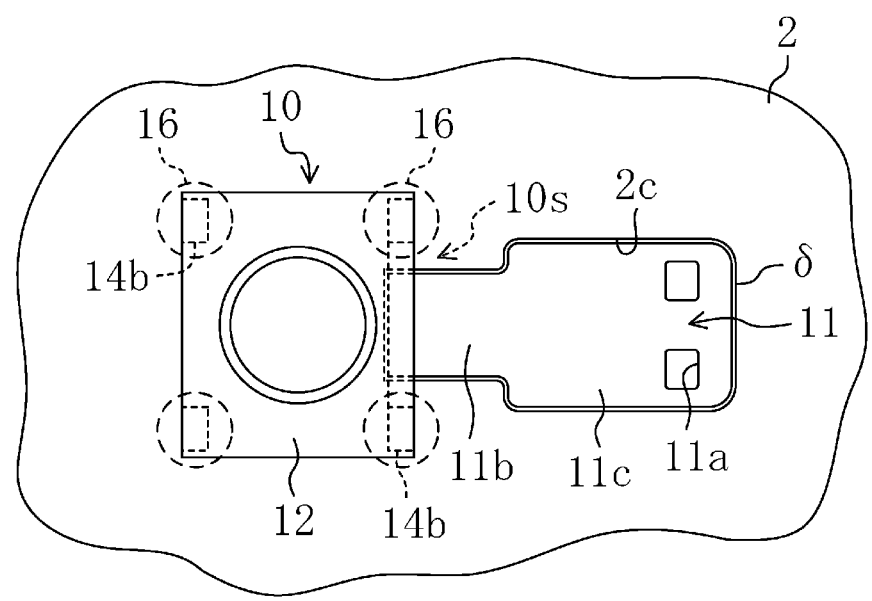
FIG. 4 is a plan view illustrating part of the circuit board unit of FIG. 1 around the terminal block.

As illustrated in FIGS. 2-4, the terminal base (10) is formed by bending a metal plate, and a cross-sectional area of part of the terminal block (10) where current flows is large. Thus, the amount of heat generation of the terminal block (10) is smaller as compared to that in the case where current flows through the printed wiring pattern (copper foil), thereby reducing the influence of heat on the printed circuit board (2).

As described above, current flowing between the power module (3) and each of the electrical wires (8) mainly flows through the terminal block (10).

The terminal base (10) is a bent component formed from a single conductive metal plate. The wire connection part (12) of the terminal base (10) is formed in a square or rectangular shape as viewed in the plane. The leg parts (14) are formed by downwardly bending, at bent parts (12a), a pair of opposing edge parts of the seat plate (13) of the wire connection part (12) at an angle of about 90 degrees. The bent part (12a) defines a right-angled corner in the figure, but actually defines a slightly-rounded surface (curved surface).

In order to hold the electrical wire (8) by tightening a retaining screw (9) which is an attachment screw illustrated in FIG. 3, an internal screw part (12b) is formed in a burring-processed part (12c) of the wire connection part (12) as illustrated in FIG. 2. Note that, in substitution for the burring-processed part (12c), a nut may be welded to the wire connection part (12) or may be swaged and fixed to the wire connection part (12). The retaining screw (9) is tightened into the internal screw part (12b) through a washer (9a), and the electrical wire (8) is held so as to be sandwiched between an upper surface of the wire connection part (12) and the washer (9a). Note that the electrical wire (8) may be attached to the wire connection part (12) by a method using a component other than the retaining screw (9).

Each of the leg parts (14) includes fixing tips (soldered parts) (14b) for fixing the terminal base (10) to the predetermined attachment positions of the board part (2a) of the printed circuit board (2) by soldering, and functions as an attachment part for attaching the terminal base (10) to the printed circuit board (2).

Two fixing tips (14b) are formed in each of the opposing leg parts (14), and attachment holes (2b) are formed corresponding to the fixing tips (14b) in the predetermined attachment positions of the printed circuit board (2) (see FIG. 3). The fixing tip (14b) is formed so as to downwardly protrude beyond the attachment hole (2b) in the state in which the fixing tip (14b) is inserted into the attachment hole (2b) from the above, and part of the fixing tip (14b) downwardly protruding beyond the printed circuit board (2) is soldered to a lower surface of the printed circuit board (2).

A raised part (14c) functioning to reduce or prevent detachment of the fixing tip (14b) from the printed circuit board (2) and to position the terminal base (10) on the printed circuit board (2) is formed in each of the two fixing tips (14b) of the leg part (14) on the side on which the terminal connection part (11) is not formed. For the foregoing reason, the fixing tip (14b) is configured such that a base end part to be engaged with the attachment hole (2b) is formed so as to have a larger diameter than that of a tip end part protruding beyond the attachment hole (2b) and the base end part is pressed into the attachment hole (2b). The two fixing tips (14b) are formed in the present embodiment, but a single or more than three fixing tips (14b) may be formed.

As illustrated in FIG. 4, each of the fixing tips (14b) is formed apart from the terminal connection part (11) a predetermined distance, and therefore non-soldered spaces (10s) are provided so that a land for solder (16) indicated by a dashed line in FIG. 4 can be provided around each of the fixing tips (14b).

The terminal connection part (11) is formed so as to extend from a lower end of one of the leg parts (leg part on the right side as viewed in FIG. 2) (14) in the direction away from the other leg part (leg part on the left side as viewed in FIG. 2) (14) and to be substantially parallel to the seat plate (13). As described above, the plate-shaped terminal connection part (11) extends from the wire connection part (12).

The terminal connection part (11) is connected to an extension part (14d) formed in a lower middle part of the leg part (14), through a bent part (14a). The extension part (14d) is positioned between the fixing tips (14b) and, as illustrated in FIG. 3, is formed to have such a length that the extension part (14d) downwardly protrudes beyond the printed circuit board (2) in the state in which the terminal block (10) is attached to the printed circuit board (2). The bent part (14a) is bent at the right angle with respect to the leg part (14).

The terminal connection part (11) includes a joint part (11b) and a pin connection part (11c), and is formed in a flat plate shape. The joint part (11b) extends from the extension part (14d) of the leg part (14) toward the side of the leg part (14). Specifically, the joint part (11b) is outwardly bent at the right angle with respect to the leg part (14) and is formed so as to have a slightly narrower width than that of the pin connection part (11c).

The pin connection part (11c) is formed in a rectangular plate shape so as to be connected to the joint part (11b) at a tip end thereof, and terminal pin insertion holes (11a) into each of which the terminal pin (3a) of the power module (3) is to be inserted are formed in positions of the pin connection part (11c) closer to a tip end thereof. The terminal pins (3a) upwardly protruding with the terminal pins (3a) being inserted into the terminal pin insertion holes (11a) are bonded to the terminal connection part (11) by the soldering. Each of the terminal pin insertion holes (11a) of the terminal connection part (11) serves as a soldered part (terminal soldered part) to which the terminal pin (3a) of the power module (3) is bonded.

As illustrated in FIG. 3, the terminal block (10) is configured such that the terminal connection part (11) is parallel to the printed circuit board (2) with the terminal block (10) being attached to the printed circuit board (2) and that the dimension of a clearance between the terminal connection part (11) and the printed circuit board (2) is set to a predetermined dimension. That is, according to the foregoing configuration, the terminal block (10) can be manufactured, in which the position of the terminal connection part (11) is vertically changeable as viewed in the figure while the terminal connection part (11) is maintained parallel to the printed circuit board (2).

Particularly in the present embodiment, the terminal connection part (11) is positioned below the printed circuit board (2) as illustrated in FIG. 3.

A hole (2c) of the printed circuit board (2) is formed corresponding to the terminal connection part (11). The hole (2c) is formed so as to have an orthographic projection area larger than that of the terminal connection part (11), i.e., the joint part (11b) and the pin connection part (11c), as viewed in the plane, and is formed to have such a size that the joint part (11b) and the pin connection part (11c) can be inserted into the hole (2c) as illustrated in FIG. 4. In addition, the hole (2c) is formed to have such a planar area that a clearance 8 is defined between an inner circumferential surface of the hole (2c) and an outer circumferential surface of the joint part (11b) and the pin connection part (11c) as viewed in the plane.

An upper surface of the terminal connection part (11) is exposed on an upper side of the printed circuit board (2) through the hole (2c), and the hole (2c) promotes a heat dissipation effect.

As described above, in the present embodiment, the terminal connection part (11) is formed in the plate shape and is positioned below the hole (2c) of the printed circuit board (2). Thus, the terminal pins (3a) of the power module (3) are bonded to the terminal connection part (11) arranged in the position corresponding to the hole (2c) formed in the printed circuit board (2) (arranged below the hole (2c)). In addition, the electrical wire (8) is connected to the wire connection part (12), and current from the power module (3) flows into the electrical wire (8) through the terminal block (10).

A heat dissipating fin (15) is connected to the power module (3). As illustrated in FIG. 3, the leg parts (14) of the terminal block (10) are connected to a back surface of the board part (2a) of the printed circuit board (2) by the soldering.

The terminal pins (3a) are inserted into the terminal pin insertion holes (11a) of the terminal connection part (11) of the terminal block (10), and the terminal pins (3a) and the terminal connection part (11) are bonded together by the soldering with part of the terminal pins (3a) upwardly protruding beyond the terminal pin insertion holes (11a). As described above, in the present embodiment, the terminal block (10) is arranged on the upper side of the printed circuit board (2), and the power module (3) is arranged on a lower side of the printed circuit board (2). Thus, the terminal block (10) and the power module (3) are arranged on different sides of the printed circuit board (2).

Next, the air conditioning apparatus (refrigerating apparatus) including the control device with the circuit board unit (1) will be described.

Figure 7:
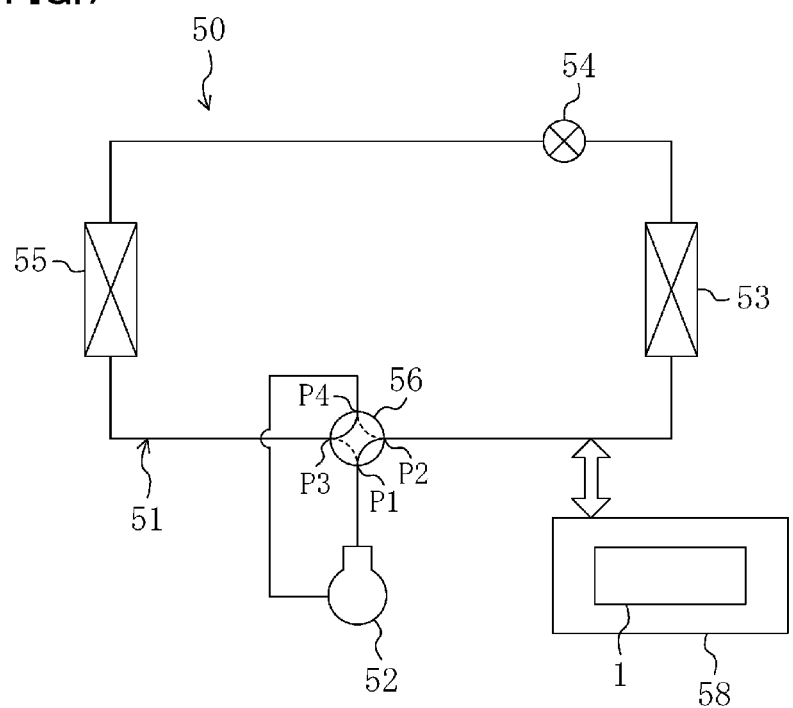
FIG. 7 is a refrigerant circuit diagram of an air conditioning apparatus including a control device with the circuit board unit of FIG. 1.

FIG. 7 is a refrigerant circuit diagram of an air conditioning apparatus (50). A refrigerant circuit (51) of the air conditioning apparatus (50) includes the compressor (52), an outdoor heat exchanger (heat-source-side heat exchanger) (53), an expansion valve (expansion mechanism) (54), an indoor heat exchanger (utilization-side heat exchanger) (55), and a four way valve (56). The foregoing components are connected together through refrigerant pipes to form a closed circuit. The compressor (52) is a variable capacity compressor, the operational capacity of which is adjustable by an inverter control of an electric motor.

Ports (P1-P4) of the four way valve (56) are connected to an outlet of the compressor (52), the outdoor heat exchanger (53), the indoor heat exchanger (55), and an inlet of the compressor (52), respectively.

In a cooling operation of the air conditioning apparatus (50), the four way valve (56) is switched to a first position indicated by a solid line in FIG. 7. After refrigerant discharged from the compressor (52) is condensed in the outdoor heat exchanger (53), the pressure of such refrigerant is reduced by the expansion valve (54). Then, the refrigerant is evaporated in the indoor heat exchanger (55) and returns to the compressor (52). In the indoor heat exchanger (55), indoor air is cooled, thereby cooling an inside of a room.

On the other hand, in a heating operation, the four way valve (56) is switched to a second position indicated by a dashed line in FIG. 7. After refrigerant discharged from the compressor (52) is condensed in the indoor heat exchanger (55), the pressure of such refrigerant is reduced by the expansion valve (54). Then, the refrigerant is evaporated in the indoor heat exchanger (55) and returns to the compressor (52). In the indoor heat exchanger (55), indoor air is heated, thereby heating the inside of the room.

Advantages of First Embodiment

In the present embodiment, current of the main circuit supplied from the external power supply through the power module (3) flows into the electrical wires (8) through the terminal blocks (10) and is supplied to the inverter-driven compressor (52). In the conventional configuration, high current of the main circuit supplied through the power module (3) flows through the copper foil of the printed circuit board (2), and there is the problem that, since the cross-sectional area of the copper foil is small, the influence on the printed circuit board (2) is increased due to the increase in temperature of the copper foil. On the other hand, in the present embodiment, since high current flows from the power module (3) to the electrical wire (8) through the terminal block (10), such current does not flow through the copper foil of the printed circuit board (2).

The terminal block (10) is formed from the metal plate, and the terminal block (10) having a sufficient thickness can be easily formed. Thus, a resistance value of the terminal block (10) can be lowered. As a result, the heat generation of the terminal block (10) can be reduced. In addition, since the terminal block (10) itself is made of metal and upper and lower surfaces of the terminal connection part (11) are exposed, the heat dissipation effect can be also expected. Thus, an increase in temperature of the printed circuit board (2) can be also reduced. Conventionally, even if an expensive printed circuit board (2) is used, current of about 30 A is supplied to a target to be driven at the maximum. On the other hand, the present embodiment is applicable to the case where it is required that higher current of about 45-60 A is applied by, e.g., a high-voltage inverter.

As described above, high current can flow through the circuit board unit (1) of the present embodiment even if an inexpensive printed circuit board (2) having thin copper foil is used. In addition, the terminal block (10) which is the connection member of the present invention is an extremely small component having a dimension of several centimeters, and high current can be prevented from flowing through the copper foil without expanding the width of the copper foil of the printed circuit board (2). Thus, an increase in size of the printed circuit board (2) can be prevented. This brings about an extremely large economic effect.

The single metal plate is bent to form the terminal block (10), thereby simplifying a manufacturing process. In addition, the terminal block (10) is a separate component for each terminal and can be used as a general component. Thus, component arrangement on the printed circuit board (2) can be freely changed, and it is extremely easy to use the terminal block (10) in another printed circuit board. This brings about a great advantage that a development schedule can be shortened.

In order to realize a flow of high current through the circuit board unit (1), a component (a so-called "electrical circuit board") in which busbars are covered with resin or a component in which busbars are embedded in a printed circuit board (2) may be used.

However, in such a case, a unit price is significantly increased, and it is difficult to use such a component for another printed circuit board. Thus, a large component for exclusive use is required for each theme in printed circuit board development, thereby increasing an initial investment. Consequently, the timing of commercialization is missed or a product price is increased. On the other hand, such problems are not caused according to the present embodiment.

In the present embodiment, the terminal base (10) is the bent component. By employing the bending, there is an advantage that a configuration of the terminal base (10) is simplified, and therefore it is advantageous for commercialization.

Since the terminal connection part (11) is arranged below the hole (2c) formed in the printed circuit board (2), the terminal connection part (11) is exposed to air therearound. Thus, heat dissipation from the terminal block (10) is promoted. In addition, since the printed circuit board (2) and the terminal connection part (11) do not contact each other, it is less likely that heat from the power module (3) is transferred to the printed circuit board (2). Thus, high current can flow through the electrical wire (8).

Second Embodiment of the Invention

Next, a second embodiment of the present invention will be described in detail with reference to drawings.

Figure 8:
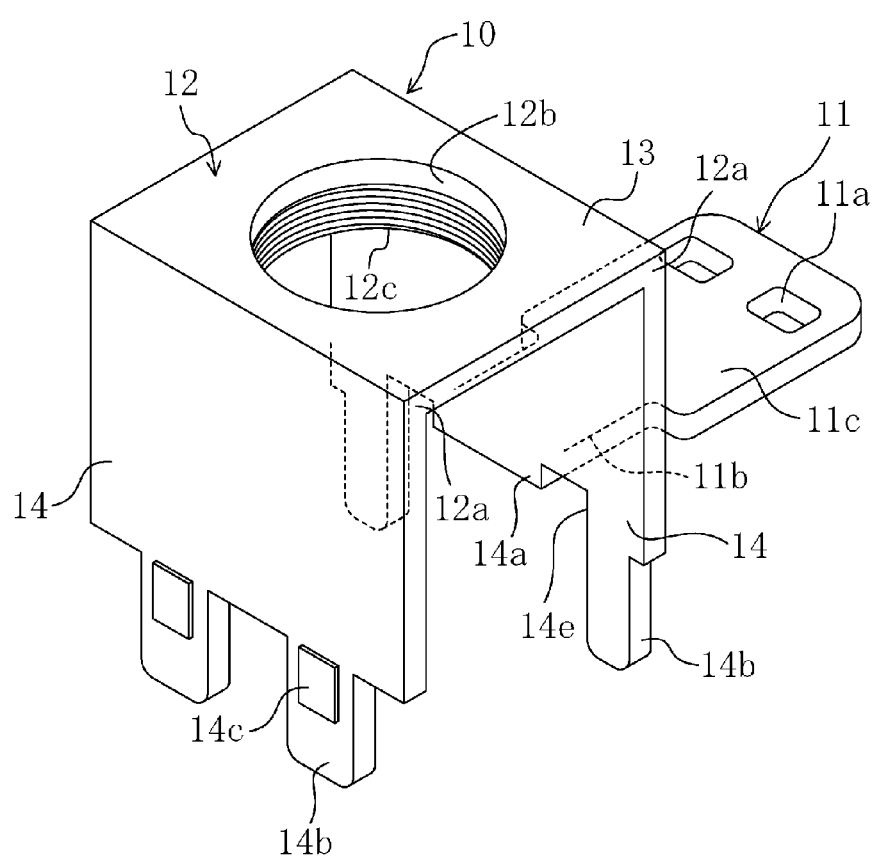
FIG. 8 is an enlarged perspective view of a terminal block of a second embodiment.
Figure 9:
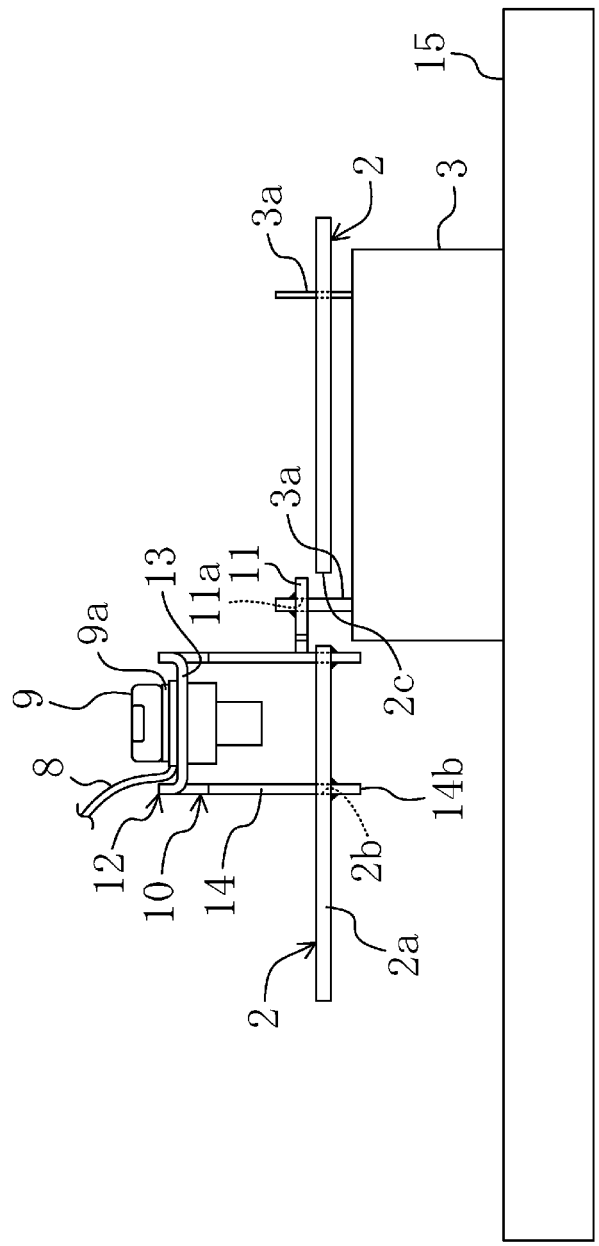
FIG. 9 is a side view illustrating a main part of a circuit board unit of the second embodiment.

As illustrated in FIGS. 8 and 9, a terminal connection part (11) of a terminal block (10) is arranged above a printed circuit board (2) in the second embodiment, instead of arranging the terminal connection part (11) of the terminal block (10) below the printed circuit board (2) as in the first embodiment.

Specifically, notch parts (14e) are formed in a lower middle part of a leg part (14) of a wire connection part (12) of the terminal block (10) by upwardly cutting part of the leg part (14) between fixing tips (14b). The terminal connection part (11) is connected to the leg part (14) through a bent part (14a) so as to extend from upper sides of the notch parts (14e) toward the outside relative to the leg part (14).

As illustrated in FIG. 9, the terminal block (10) is configured such that the terminal connection part (11) is parallel to the printed circuit board (2) with the terminal block (10) being attached to the printed circuit board (2) and that the dimension of a clearance between the terminal connection part (11) and the printed circuit board (2) is set to a predetermined dimension. That is, in the present embodiment, the terminal connection part (11) is positioned above the printed circuit board (2).

In the printed circuit board (2), a hole (2c) corresponding to the terminal connection part (11) is formed below the terminal connection part (11). As in the first embodiment, the hole (2c) is formed so as to have an orthographic projection area larger than that of the terminal connection part (11), i.e., a joint part (11b) and a pin connection part (11c), as viewed in the plane.

Other configurations, operations, and advantages are similar to those of the first embodiment.

Third Embodiment

Next, a third embodiment of the present invention will be described in detail with reference to drawings.

Figure 10:
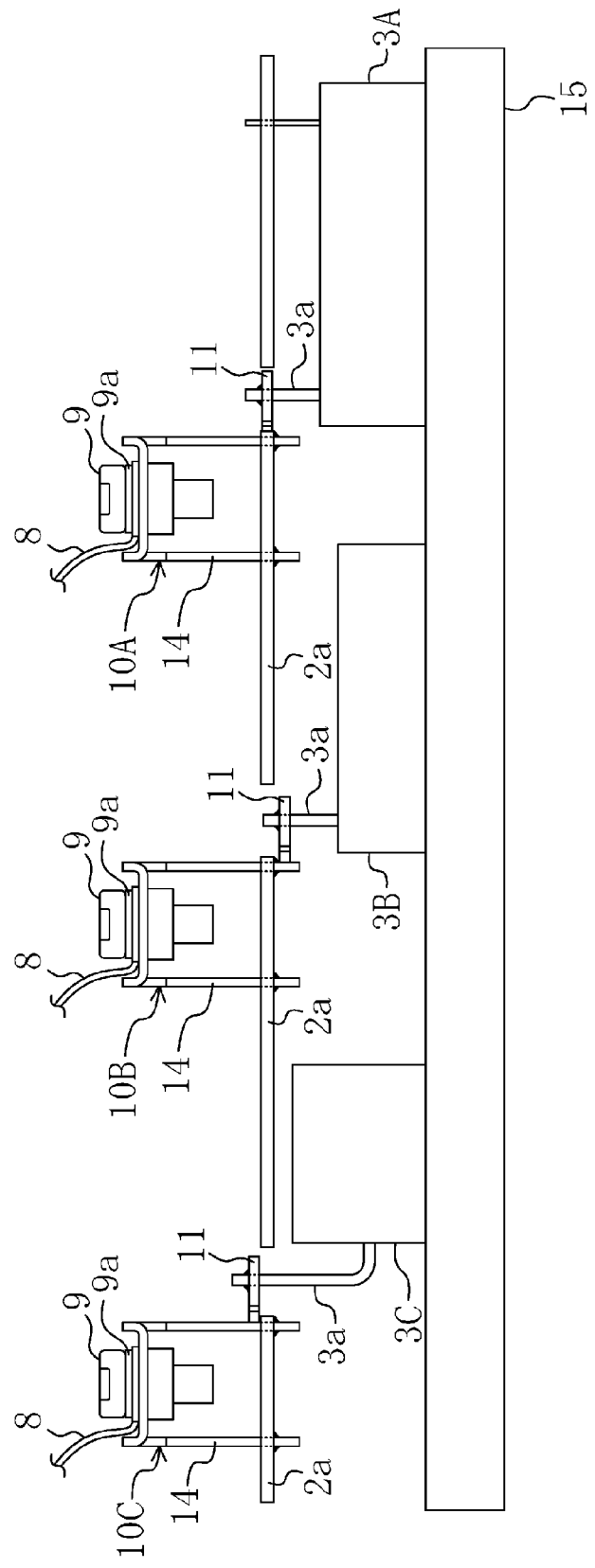
FIG. 10 is a side view illustrating a main part of a circuit board unit of a third embodiment.
Figure 11:
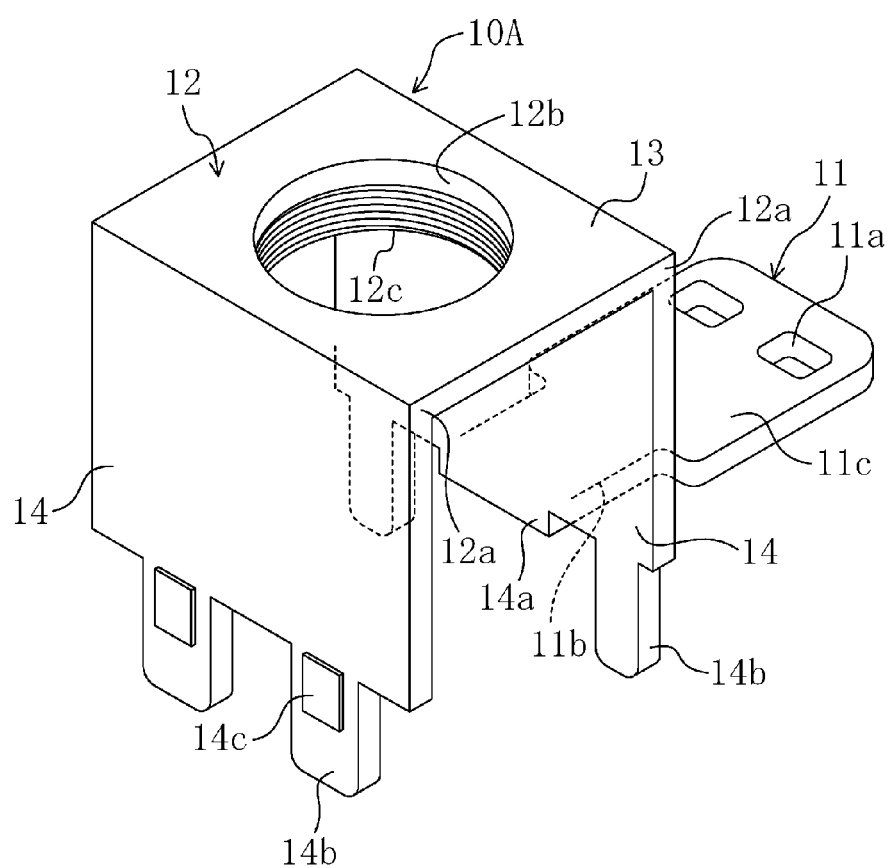
FIG. 11 is an enlarged perspective view of a first terminal block of the third embodiment.
Figure 12:
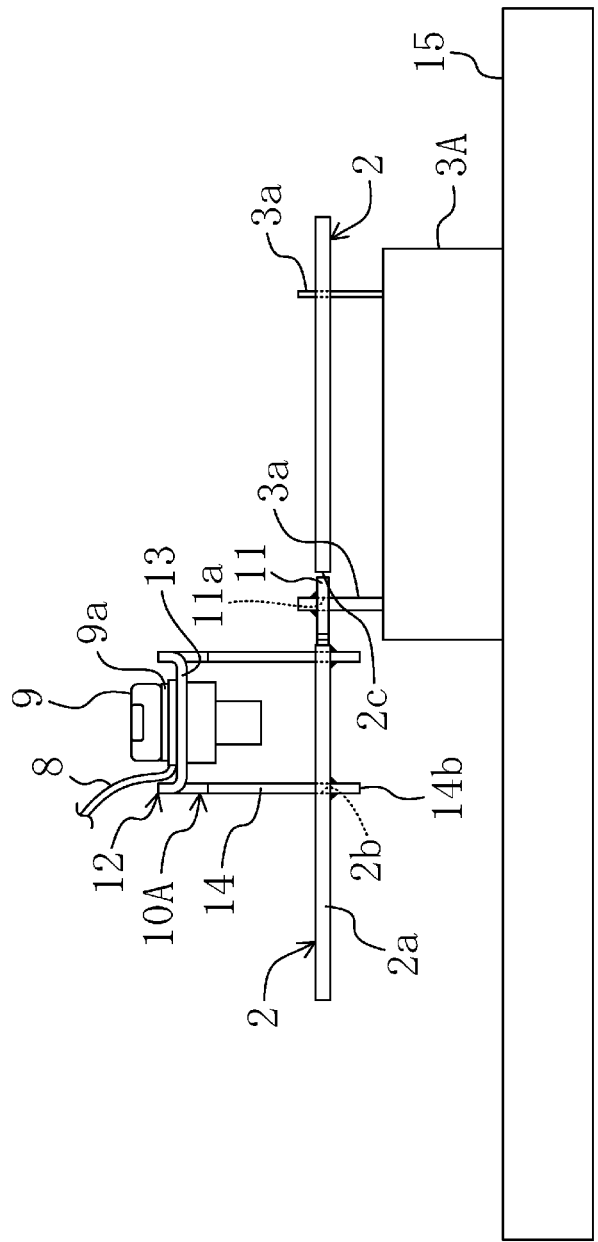
FIG. 12 is a side view illustrating the main part of the circuit board unit around the first terminal block in the third embodiment.

As illustrated in FIGS. 10-12, three power modules (3A, 3B, 3C) are provided in the third embodiment, instead of providing the single power module (3) as in the first embodiment.

Specifically, in a circuit board unit (1) of the third embodiment, the first power module (3A), the second power module (3B), and the third power module (3C) are mounted. The three power modules (3A, 3B, 3C) are inverter modules or converter modules.

Each of the power modules (3A, 3B, 3C) is arranged on a back side of a printed circuit board (2) and is attached to a heat dissipating fin (15). The power modules (3A, 3B, 3C) are different from each other in vertical height (thickness). The first power module (3A) is formed so as to have a standard height. The second power module (3B) is formed so as to have a height lower than that of the first power module (3A). The third power module (3C) is formed so as to have a height higher than that of the first power module (3A).

Three terminal blocks (10A, 10B, 10C) to be connected to the power modules (3A, 3B, 3C) correspond to the power modules (3A, 3B, 3C), respectively.

Specifically, in the circuit board unit (1) of the third embodiment, the first terminal block (10A), the second terminal block (10B), and the third terminal block (10C) are provided.

As illustrated in FIGS. 11 and 12, in the first terminal block (10A), a terminal connection part (11) is connected to a lower end part of a leg part (14) between fixing tips (14b) through a bent part (14a). The terminal connection part (11) extends toward the outside relative to the leg part (14).

As illustrated in FIG. 12, the first terminal block (10A) is arranged such that the terminal connection part (11) is parallel to the printed circuit board (2) with the first terminal block (10A) being attached to the printed circuit board (2). In addition, the first terminal block (10A) is arranged inside a hole (2c) of the printed circuit board (2), i.e., the first terminal block (10A) is arranged such that the terminal connection part (11) is in the same plane as the printed circuit board (2). As in the first embodiment, the hole (2c) is formed so as to have an orthographic projection area larger than that of the terminal connection part (11), i.e., a joint part (11b) and a pin connection part (11c), as viewed in the plane. In addition, a clearance 8 is formed between an inner circumferential surface of the hole (2c) and an outer circumferential surface of the joint part (11b) and the pin connection part (11c) as viewed in the plane (see FIG. 4).

The second terminal block (10B) has the structure described in the first embodiment, and a terminal connection part (11) of the second terminal block (10B) is arranged below the printed circuit board (2).

The third terminal block (10C) has the structure described in the second embodiment, and a terminal connection part (11) of the third terminal block (10C) is arranged above the printed circuit board (2).

As described above, if the plurality of power modules (3A, 3B, 3C) having different heights are provided, the power modules (3A, 3B, 3C) are different from each other in height at which the power module (3A, 3B, 3C) can be soldered to the printed circuit board (2).

If the plurality of power modules (3A, 3B, 3C) having different heights are provided, it is difficult to attach the power modules (3A, 3B, 3C) to the same printed circuit board (2). Thus, the heights of the power modules (3A, 3B, 3C) are conventionally adjusted by using two separate printed circuit boards (2) or by employing another power module (3A, 3B, 3C) which is inferior in performance or cost.

Conventionally, in order to adjust height positions of terminal pins (3a) of the power modules (3A, 3B, 3C), a raising plate for the position adjustment of the second power module (3B) having a lower height is inserted between the second power module (3B) and the heat dissipating fin (15), and part of the heat dissipating fin (15) is cut off for the position adjustment of the third power module (3C) having a higher height.

The reason why there are the power modules (3A, 3B, 3C) having different heights is that the length of the terminal pin (3a) is generally determined for each power module type. Thus, if the power modules (3A, 3B, 3C) having different heights are mounted, the power modules (3A, 3B, 3C) are different from each other in height at which the power module (3A, 3B, 3C) is soldered.

On the other hand, in the present embodiment, since several types of the terminal blocks (10A, 10B, 10C) which are different from each other in height position of the terminal connection part (11) are prepared, even the power modules (3A, 3B, 3C) having different heights can be mounted on the same printed circuit board (2). This can be realized because the terminal connection part (11) is parallel to the printed circuit board (2) with the terminal block (10A, 10B, 10C) being attached to the printed circuit board (2) and the dimension of a clearance between the terminal connection part (11) and the printed circuit board (2) is set to a predetermined dimension.

In the foregoing manner, even if the heights of the power modules (3) are different from each other, the plurality of power modules (3) can be easily connected to the single printed circuit board (2).

The terminal pins (3a) of the power module (3) are bonded to the terminal connection part (11) arranged parallel to the printed circuit board (2) outside the hole (2c) formed in the printed circuit board (2), and an electrical wire (8) is connected to a wire connection part (12). Current from the power module (3) flows into the electrical wire (8) through the terminal block (10).

Other configurations, operations, and advantages are similar to those of the first embodiment.

Variation of Third Embodiment

First Variation

In the third embodiment, the three types of the power modules (3A, 3B, 3C) having different heights are mounted. However, a first power module (3A) having a standard height and a second power module (3B) having a height lower than that of the first power module (3A) may be mounted.

In the foregoing case, a first terminal block (10A) including a terminal connection part (11) arranged inside a hole (2c) of a printed circuit board (2) and a second terminal block (10B) including a terminal connection part (11) arranged below the printed circuit board (2) as in the first embodiment are used.

Alternatively, a first power module (3A) having a standard height and a third power module (3C) having a height higher than that of the first power module (3A) may be mounted.

In the foregoing case, a first terminal block (10A) including a terminal connection part (11) arranged inside a hole (2c) of a printed circuit board (2) and a third terminal block (10C) including a terminal connection part (11) arranged above the printed circuit board (2) as in the second embodiment are used.

If a second power module (3B) having a lower height and a third power module (3C) having a higher height are mounted, the height of a printed circuit board (2) is adjusted to the height of either one of the power modules (3B, 3C), and therefore either one of the foregoing examples of the first variation may be applied.

Second Variation

Figure 13:
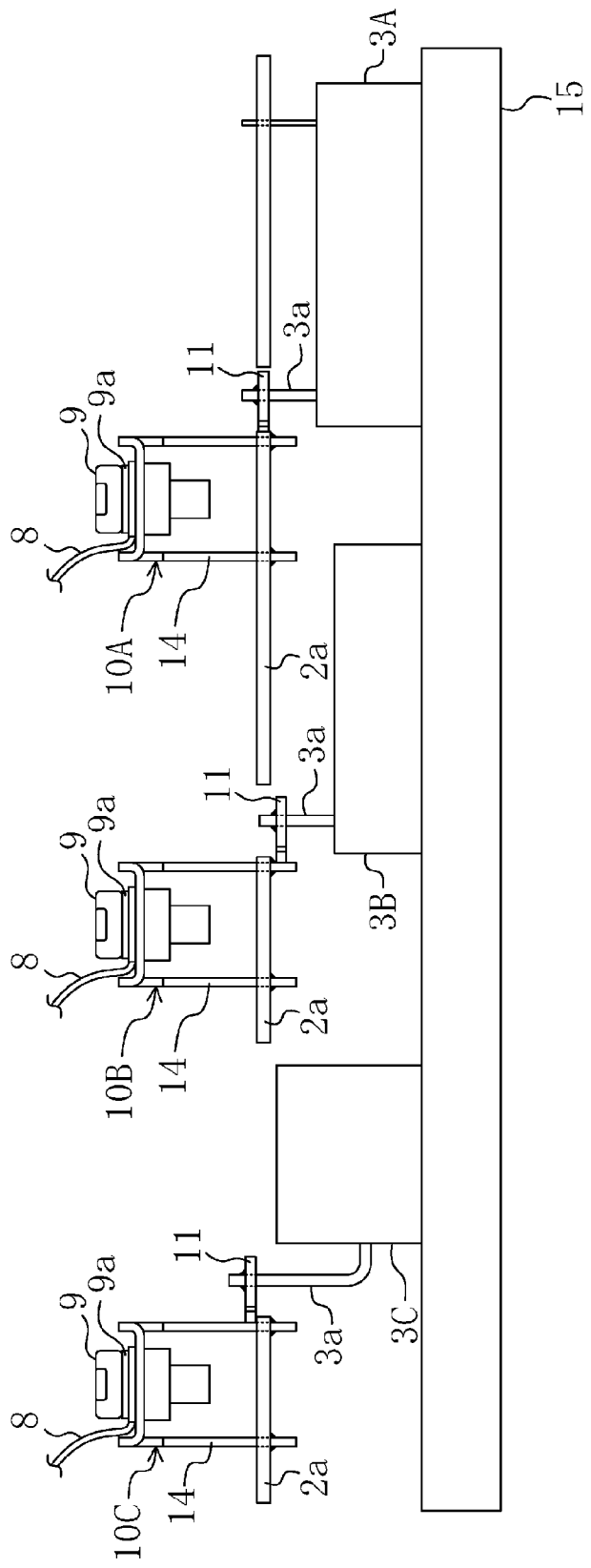
FIG. 13 is a side view illustrating a main part of a circuit board unit of a variation of the third embodiment.

If a third power module (3C) having a higher height is mounted, a hole (2c) of a printed circuit board (2) may be formed to have such a dimension that an upper part of the third power module (3C) can be exposed as illustrated in FIG. 13.

Fourth Embodiment of the Invention

Next, a fourth embodiment of the present invention will be described in detail with reference to drawings.

Figure 14:
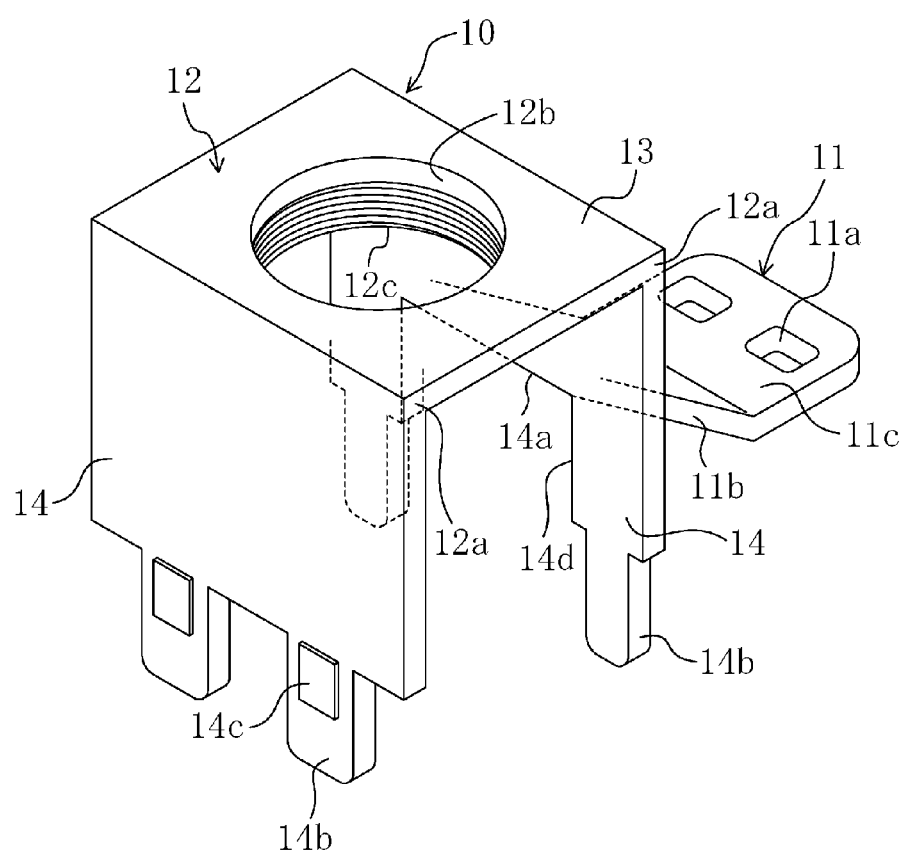
FIG. 14 is an enlarged perspective view of a terminal block of a fourth embodiment.

As illustrated in FIG. 14, a terminal connection part (11) of a terminal block (10) is bent at an oblique angle in the fourth embodiment, instead of bending the terminal connection part (11) of the terminal block (10) at the right angle as in the first embodiment.

Specifically, in the terminal block (10), a joint part (11b) of the terminal connection part (11) defines an oblique surface. That is, a notch part (14e) is formed in a lower middle part of a leg part (14) of a wire connection part (12) of the terminal block (10) by upwardly cutting part of the leg part (14) between fixing tips (14b). The terminal connection part (11) is connected to the leg part (14) through a bent part (14a) so as to extend from an upper side of the notch part (14e) toward the outside relative to the leg part (14). The joint part (11b) of the terminal connection part (11) is formed so as to have the same width as that of a pin connection part (11c).

Since the joint part (11b) of the terminal block (10) is not necessarily formed so as to have a narrow width as in the joint part (11b) of the first embodiment, high current can flow therethrough. In addition, since the joint part (11b) is a non-contact part which does not contact the printed circuit board (2), the non-contact part allows a function of a heat dissipating fin to be fulfilled.

Other configurations, operations, and advantages are similar to those of the first embodiment. In the present embodiment, a hole (2c) of the printed circuit board (2) may have a dimension corresponding only to the pin connection part (11c) in the case where the terminal connection part (11) is positioned above the printed circuit board (2) as in the second embodiment and the case where the pin connection part (11c) of the terminal connection part (11) is in the same plane as the printed circuit board (2) as in the third embodiment.

Fifth Embodiment of the Invention

Next, a fifth embodiment of the present invention will be described in detail with reference to drawings.

As illustrated in FIG. 15, a terminal block (10) has a two-piece structure in the fifth embodiment, instead of forming the terminal block (10) from a single member as in the first embodiment.

Specifically, the terminal block (10) includes a terminal connection part (11) which is configured as a first member, and a wire connection part (12) which is configured as a second member supporting the terminal connection part (11) and attached to a printed circuit board (2).

The terminal connection part (11) is formed by bending a band-shaped conductive metal plate having a uniform width. The terminal connection part (11) includes a fixed part (11d) mounted and fixed onto the wire connection part (12), a joint part (11b) downwardly extending from one end of the fixed part (11d) at an angle of 90°, and a pin connection part (11c) extending from a lower end of the joint part (11b) at an angle of 90° in the direction away from the fixed part (11d). A through-hole (11e) into which a retaining screw (9) is inserted is formed in the fixed part (11d), and terminal pin insertion holes (11a) are formed in the pin connection part (11c) as terminal soldered parts.

The wire connection part (12) is a support member for supporting the terminal connection part (11) and is formed by bending a band-shaped metal plate having a wider width than that of the terminal block (10) of the first embodiment. The wire connection part (12) includes a seat plate (13) onto which the fixed part (11d) of the terminal connection part (11) is mounted and fixed, and leg parts (attachment parts) (14) downwardly extending parallel to each other from both ends of the seat plate (13) at an angle of 90°. Note that the width of the terminal connection part (11) and the width of the wire connection part (12) are determined as necessary.

The angle between the fixed part (11d) and the joint part (11b) and the angle between the joint part (11b) and the pin connection part (11c) have been described as 90°. However, on the condition that the fixed part (11d) and the pin connection part (11c) are parallel to each other (parallel to the horizontal direction), the angle between the fixed part (11d) and the joint part (11b) and the angle between the joint part (11b) and the pin connection part (11c) may be set as necessary.

An internal screw part (12b) into which the retaining screw (9) is tightened to hold an electrical wire is formed in a burring-processed part (12c) of the seat plate (13). The burring-processed part (12c) may be formed in such a shape that a nut is welded thereto or is swaged and fixed thereto. The retaining screw (9) is tightened into the internal screw part (12b) through a crimp terminal (8a) of the electrical wire (8) and a washer (plain washer or spring washer) (9a) in the state in which the through-hole (11e) formed in the fixed part (11d) of the terminal connection part (11) is positioned corresponding to the internal screw part (12b). Thus, the crimp terminal (8a) of the electrical wire (8) is held so as to be sandwiched between an upper surface of the fixed part (11d) of the terminal connection part (11) and the washer (9a).

As in the first embodiment, two fixing tips (14b) at a lower end of each of the leg parts (14), i.e., the total of four fixing tips (14b) are formed. Although the two fixing tips (14b) are formed in the present embodiment, the number of fixing tips (14b) may be freely changed as long as the terminal connection part (11) and the wire connection part (12) can be supported. As in the first embodiment, the fixing tip (14b) is formed to have such a length that the extension part (14d) downwardly protrudes beyond an attachment hole (2b) formed in a predetermined attachment position of the printed circuit board (2) in the state in which the fixing tip (14b) is inserted into the attachment hole (2b) from the above, and part of the fixing tip (14b) downwardly protruding beyond the printed circuit board (2) is soldered to a lower surface of the printed circuit board (2). Although not shown in the figure, the present embodiment is similar to the first embodiment in that a raised part (not shown in the figure) functioning to reduce or prevent detachment of the wire connection part (12) from the printed circuit board (2) and to position the terminal base (10) on the printed circuit board (2) is formed in each of the fixing tips (14b).

Since the present embodiment is similar to the first embodiment in configurations of the printed circuit board (2) and an air conditioning apparatus, the description thereof will not be repeated.

According to the present embodiment, since the terminal connection part (11) and the wire connection part (12) supporting the terminal connection part (11) are the separate members, only the terminal connection part (11) may be replaced corresponding to the height of the terminal pin (3a) of the power module (3).

Other configurations, operations, and advantages are similar to those of the first embodiment.

Other Embodiment

Each of the foregoing embodiments may have the following configurations.

In the first embodiment, the soldering is used to bond the leg parts (14) to the board part (2a) of the printed circuit board (2) and to bond the terminal pins (3a) of the power module (3) to the terminal connection part (11). The soldering is advantageous to size reduction. However, only for the purpose of realizing a flow of high current through the circuit board unit (1), a bonding method other than the soldering may be used.

The electrical wire (8) is not necessarily attached to the wire connection part (12) with the screw. Other than the structure using the screw, various connection structures such as the structure using an eyelet, the structure using a so-called "faston tab" (the structure in which a tab is inserted into a receptacle), the structure using a swage, and the structure employing welding may be employed.

The internal screw part (12b) for wire connection may be provided in the leg part (14) of the terminal block (10).

Since the terminal shape is different depending on the power module (3) to be used, the position, shape, and number of the terminal pin insertion holes (11a) may be designed depending on the power module (3) to be used.

In each of the foregoing embodiments, the terminal block (10) has been described as the connection member, but the connection member may be formed in any shapes other than the foregoing.

In each of the foregoing embodiments, the example where the circuit board unit (1) is employed in the air conditioning apparatus (50) has been described. However, as a target in which the circuit board unit (1) is employed, the circuit board unit (1) may be employed in refrigerating apparatuses in general.

Note that the foregoing embodiments have been set forth merely for purposes of preferred examples in nature and are not intended to limit the scope, applications, and use of the invention.

Example

Next, a relationship between a dimension and a temperature increase in an example of a terminal block (10) which is a connection member will be described with reference to FIG. 16.

In general, a practical temperature increase value of a printed circuit board is less than 20 K. A graph of current density and the temperature increase in FIG. 16 shows the following. When the temperature increase value is 20 K, the width of copper foil of a printed circuit board is 26 mm (passage of current of 30 A) and 70 mm (passage of current of 60 A) for a copper foil thickness of 35 μm. When a double-sided board is used, the width is reduced by half and is 13 mm (passage of current of 30 A) and 35 mm (passage of current of 60 A) for each side. Due to influences of heat generation (about 50 K) of a semiconductor inside a power module and heat generation (about 80 K for passage of current of 60 A) of a terminal pin, a wider copper foil width is actually required.

Suppose, as an example, that a commercially-available 100-ampere module having terminal pin cross-sectional dimensions of 1.15 mm×0.8 mm is used. A terminal pin cross-sectional area is about 0.95 mm². If a distance between adjacent ones of terminal pins of the module is 7.6 mm, the maximum possible copper width of a printed circuit board on which the module is mounted is about 6 mm for each side, considering an insulating distance between the adjacent ones of the terminal pins. Thus, even if a 70-micrometer double-sided board which has the thickest copper foil among general-purpose printed circuit boards is used, current of 30 A can pass therethrough in a conventional structure at the maximum.

On the other hand, when the connection member (10) of each of the foregoing embodiments is used, a current path width required for the connection member (10) manufactured so as to have a thickness of 1.2 mm is 2.5 mm for passage of current of 60 A. Such a width is well within the maximum width of 6 mm, and therefore no practical disadvantages are caused upon a use of the connection block (10).

There is a power module rated at current of about 100 A as a power module to be mounted on a printed circuit board, and a trend seems to pursue a flow of higher current through a circuit board unit. Conventionally, even the 70-micrometer double-sided board which has the thickest copper foil among general-purpose printed circuit boards cannot be used for purposes involving the passage of current of 30 A or higher. The connection member (10) of the present invention is employed for the power module rated at high current. The connection member (10) of the present invention is used for the purposes involving a passage of current of 30 A or higher, thereby using the power module up to the rated current thereof. In addition, the connection member (10) of the present invention is useful for size reduction and wiring simplification. The connection member (10) of the present invention does not obstruct mounting of the power module on the printed circuit board.

INDUSTRIAL APPLICABILITY

As described above, the present invention is useful as the circuit board unit in which the circuit element of the electrical circuit including the printed circuit board is connected to the electrical wires.

DESCRIPTION OF REFERENCE CHARACTERS

1 Circuit Board Unit
2 Printed Circuit Board
2c Hole
3 Power Module (Circuit Element)
3a Terminal Pin
8 Electrical Wire
10 Terminal Block (Connection Member)
11 Terminal Connection Part
11b Joint Part
11c Pin Connection Part
12 Wire Connection Part
13 Seat Plate
14 Leg Part
14b Fixing Tip

The invention claimed is:
1. A circuit board unit, comprising:
a printed circuit board; and
a connection member attached to the printed circuit board and connecting a circuit element of an electrical circuit and an electrical wire together, said circuit element being attached to the printed circuit board via a first terminal pin,
wherein the connection member includes
a terminal connection part directly connected to a second terminal pin of the circuit element, and
a wire connection part connected to the electrical wire,
the wire connection part has
a seat plate, and
a leg part downwardly extending from the seat plate, a lower end part of the leg part being fixed to the printed circuit board,
the terminal connection part is formed in a plate shape extending from the wire connection part and has a pin connection part for the terminal pin, at least part of said extending plate shape being parallel to the printed circuit board, a hole having an orthographic projection area at least larger than that of the pin connection part of the terminal connection part as viewed in plane is formed in the printed circuit board, and the terminal connection part is configured such that at least the pin connection part is positioned below or above the hole of the printed circuit board.

2. The circuit board unit of claim 1, the connection member being a first connection member, the circuit board unit further comprising:

a second connection member attached to the printed circuit board and connecting the circuit element of the electrical circuit and the electrical wire together, wherein the second connection member includes
a terminal connection part directly connected to a terminal pin of the circuit element, and
a wire connection part connected to the electrical wire, wherein the wire connection part of the second member has
a seat plate, and
a leg part downwardly extending from the seat plate, a lower end part of the leg part being fixed to the printed circuit board, wherein the terminal connection part of the second connection member is formed in a plate shape extending from the wire connection part and has a pin connection part for the terminal pin, wherein the terminal connection part of the first connection member is configured such that at least the pin connection part is positioned below the hole of the printed circuit board, and wherein the terminal connection part of the second connection member is configured such that at least the pin connection part is positioned inside the hole of the printed circuit board.

3. The circuit board unit of claim 1, the connection member being a first connection member, the circuit board unit further comprising:

a second connection member attached to the printed circuit board and connecting the circuit element of the electrical circuit and the electrical wire together, wherein the second connection member includes
a terminal connection part directly connected to a terminal pin of the circuit element, and
a wire connection part connected to the electrical wire, wherein the wire connection part of the second connection member has
a seat plate, and
a leg part downwardly extending from the seat plate, a lower end part of the leg part being fixed to the printed circuit board, wherein the terminal connection part of the second connection member is formed in a plate shape extending from the wire connection part and has a pin connection part for the terminal pin, wherein the terminal connection part of the first connection member is configured such that at least the pin connection part is positioned above the hole of the printed circuit board, and wherein the terminal connection part of the second connection member is configured such that at least the pin connection part is positioned inside the hole of the printed circuit board.

4. The circuit board unit of any one of claims 1-3, wherein the terminal connection part further has
a joint part connected to the leg part and bent at right angle with the leg part, and the pin connection part connected to the joint part at a tip end thereof.

5. The circuit board unit of any one of claims 1-3, wherein the terminal connection part further has
a joint part connected to the leg part and bent at oblique angle with the leg part, and the pin connection part connected to the joint part at a tip end thereof.

6. The circuit board unit of any one of claims 1-3, wherein the wire connection part of the connection member is formed from a single member, and the terminal connection part is formed from another member different from the wire connection part.

* * * * *